July 19, 1966 H. B. HERMANN 3,262,028

ELECTRICAL COMPONENT MOUNTING DEVICE

Filed April 17, 1962 2 Sheets-Sheet 1

INVENTOR.
Harold B. Hermann

July 19, 1966 H. B. HERMANN 3,262,028

ELECTRICAL COMPONENT MOUNTING DEVICE

Filed April 17, 1962 2 Sheets-Sheet 2

INVENTOR.
Harold B Hermann
BY

United States Patent Office 3,262,028
Patented July 19, 1966

3,262,028

ELECTRICAL COMPONENT MOUNTING DEVICE

Harold B. Hermann, 3036B N. San Gabriel Blvd., South San Gabriel, Calif.

Filed Apr. 17, 1962, Ser. No. 188,061
2 Claims. (Cl. 317—234)

This invention relates generally to apparatus or devices for mounting electrical components, and relates more particularly to such devices for mounting semi-conductor components or the like, such as transistors, on a wall or chassis.

Most semi-conductor devices of the transistor type, and especially those having an appreciable power rating, generate considerable heat while in operation, and this heat must be dissipated to obtain the most efficient operation of the transistors at or near their peak power rating in order that the temperature will not rise above a point where performance is degraded.

By design, power transistors have a bottom surface arranged as a heat transfer surface for the dissipation of $I^2R$ loss which are a consequence of normal operation. An unfortunate facet of such transistor design is that the conductor leads extend outwardly through that surface. Hence the designer of electronic equipment is faced with problems having conflicting solutions involving mounting the transistor, providing means for connection to the conductor leads, and providing an adequate heat sink.

One current solution to these problems is to mount the transistor on the external surface of the chassis which contains the other components. In this case, the chassis is relied on for the heat sink, and the leads extend through the wall of the chassis where connections are made to the other components which are normally located on that side of the chassis wall away from the transistor mounting side. An automobile radio of current manufacture is one example of this type of mounting expedient. It is obvious that the external placement of the transistors is objectionable due to possible mechanical damage and is not at all desirable or acceptable on professional equipment due to unsightly appearance.

Other costly expedients have been, for example, the securing of brackets or the like inside the chassis for the mounting of transistors thereupon. Another resort has been the casting of internal webs or plates integral with the container or chassis, but this method requires expensive machining operations to mill the surfaces which are to receive the transistors.

In all known structures the mounting plate or wall for the transistor disposes the case of the transistor on one side of the wall with the conductor leads extending therethrough to the other side. This invention provides a solution to these present problems confronting equipment designers by providing a transistor mount which may be disposed on one side of a wall with transistor and conductor leads on the same side of the wall, and it is a primary object to enhance the advance of the transistor art by providing such a mount device. It is a particular object to provide a transistor mount by way of a body having a transistor mounting surface and a further surface by which the body may be mounted on a chassis or the like, the body being provided with passageways extending from the transistor mounting surface and which are arranged to receive the transistor conductor leads spaced from the passageways.

It is a further object to provide a transistor mount structure which additionally functions as a heat transfer means to dissipate the heat generated in the transistor and to further conduct heat to the wall upon which the mount is secured.

It is a still further object to provide a mount characterized by heat transfer fin means which will provide an additional measure of cooling of the transistor by radiation and air convection to the ambient atmosphere.

It is another object to provide a mount adaptable to being secured to a heat sink wall with any preferred one of various directed orientations of the transistor conductor leads.

It is yet another object to provide a mount which is easily fabricated by simple metal working techniques to provide a low cost structure. In one embodiment of the mounting it is readily fabricated as a cutoff from an extruded length of the mount material, the walls of the extruded material and thus of the cutoffs defining passageways for forced air cooling.

Other objects of the invention will become apparent from the following description and claims taken in conjunction with the accompanying drawings, in which:

Figure 1:
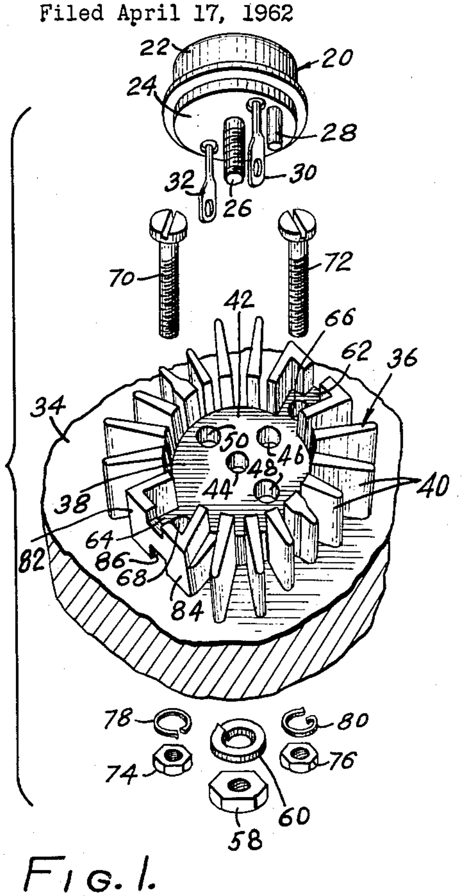
FIG. 1 is a perspective view showing the assembly relationship of one type of power transistor, a wall on which it is to be mounted and a preferred embodiment of the invention adapted to mount the transistor on the wall.

Referring to FIG. 1, a large round type power transistor 20 is shown comprising an upper housing 22 secured to a plate 24 from which extends a mounting stud 26, a locating pin 28 and a pair of electrode leads 30 and 32. In speaking of the power transistor 20, reference is made by way of example but not by way of limitation to transistors known in the art as JEDEC TO6 and TO36 types. In currently accepted manufacturing practice the electrode leads 30 and 32 comprise the emitter and base electrode leads, while the plate 24, together with the stud 26, is the collector electrode lead. In some types of transistors, as for example tetrode types, the locating pin 28 may be replaced by an electrode lead.

Almost without exception a large proportion of the $I^2R$ loss generated as heat in a transistor is generated at the collector electrode. Hence the plate 24 and stud 26 constitutes the heat transfer surface means for dissipating this heat in order to operate the transistor below any critical temperatures. This is necessary because transistors are particularly sensitive to elevated temperature conditions, with performance being seriously degraded when operated above these critical temperatures.

It will be particularly observed that the electrode leads 30 and 32 are insulated electrically from and extend through the plate 24 in addition to the extension of the stud 26 therefrom. This configuration constitutes the unfortunate facet of transistor design referred to hereinabove, and which design consideration is solved by the present invention.

Figure 3:
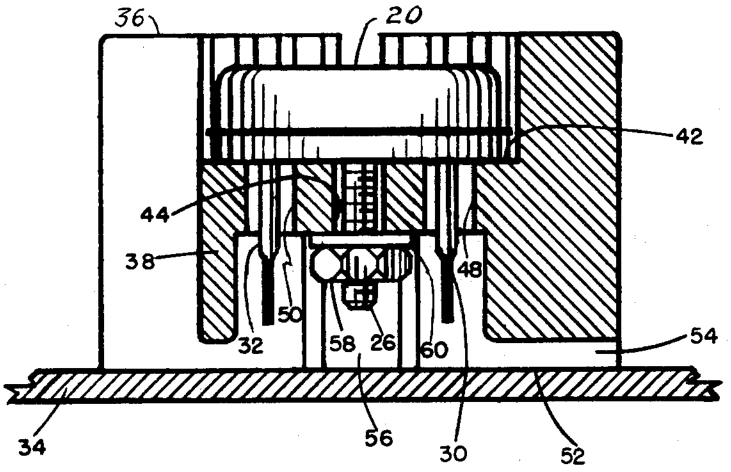
FIG. 3 is a sectioned elevation view taken on the line 3—3 of FIG. 2 on an enlarged scale.
Figure 4:
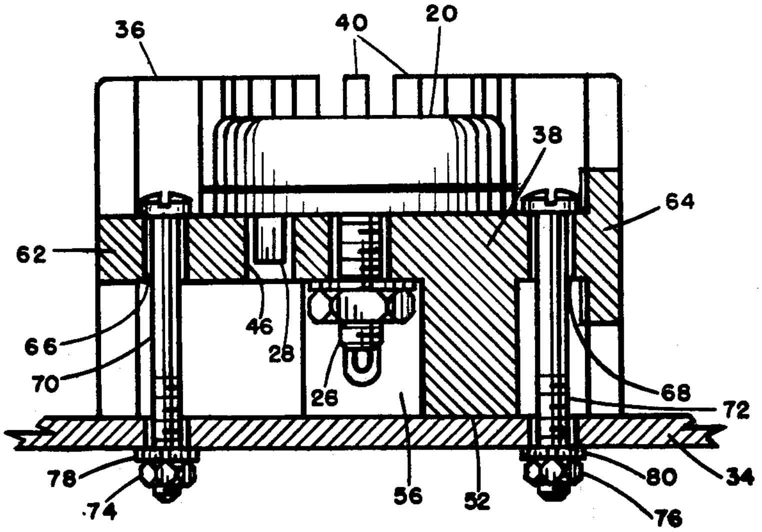
FIG. 4 is a sectioned elevation view taken on the line 4—4 of FIG. 2 on an enlarged scale and additionally showing the transistor and mount assembly secured to the wall.

Referring again to FIG. 1, there is shown a fragmentary portion 34 of a wall upon which the transistor 20 is to be mounted. Means for accomplishing such mounting comprises the mount device 36. The device 36 comprises a web portion 38 which is generally cylindrical in form, having formed at its outer peripheral edge a plurality of fins 40 extending substantially radially outwardly from the web portion 38. Preferably, the fins 40 also extend upwardly in a direction substantially coaxially of the generally cylindrical web portion 38 and from the face 42 thereof, as best seen in FIGS. 3 and 4.

The web 38 is provided with bore passageways 44, 46, 48, and 50 extending from the top face 42 thereof entirely through the web and terminating adjacent the bottom side 52 thereof at the lateral passageway 54. The passageways 44, 46, 48, and 50 are adapted to permit the stud 26, the pin 28, and the electrode leads 30 and 32, respectively, to be received therethrough; and it will be observed that the lateral passageway 54 extends somewhat into the central portion of the web to define a small well-like space 56, as best seen in FIGS. 3 and 4.

Thus, in the region of the well 56 the web 38 is of reduced section so that the transistor 20 may be secured to the device 36 by means of a nut 58 and washer 60 threaded onto the stud 26. The well 56 also provides ample space for soldering conductors (not shown) to the electrode leads 30 and 32 whereafter the conductors may be brought out through either or both ends of the lateral passageway 54. With this construction, the conductors are brought out on the transistor mounting side of the wall 34. On the other hand, it might be desirable to bring the conductors, or additional conductors, through the wall; and this is easily accomplished by providing a bore (not shown) through the wall in the vicinity of the lateral passageway 54, as will be appreciated by those skilled in the art.

It will be observed that the bore passageways 48 and 50 are of ample size so that the electrode leads 30 and 32 are spaced well away from the walls defining the passageways, and hence the leads will be electrically open from any contact with the web 38.

Referring now to FIG. 4, the device 36 is shown as provided with lug portions 62 and 64 which extend laterally outwardly from the web 38 substantially diametrically thereof, the portions 62 and 64 being provided with bore passageways 66 and 68, respectively, arranged to receive the screws 70 and 72 which secure the device 36 (and the transistor 20 mounted thereon) to the wall portion 34 by means of the nuts 74 and 76 and washers 78 and 80, respectively. From the structure as thus far described it is now evident that in manufacturing practice, where transistors are to be utilized as components of other electronic sub-assemblies or assemblies, it is a simple operation to secure them to a mount device, such as the device 36, at one assembly station by relatively unskilled personnel. After that the mounted transistors may be moved on to the next assembly station where they may be connected to conductors and secured to the sub-assembly or assembly wall, such as the wall 34, as aforesaid.

Attention is invited to the fact that the fins 40 extend somewhat beyond the upper face of the housing 22 of the transistor 20. This feature serves two purposes: firstly, it protects the transistor against accidental short circuits in the event that a thin mica washer is utilized between the plate 24 of the transistor and the web 38. This latter mentioned mounting procedure is sometimes necessary where two or more transistors are to be mounted on the same wall or chassis and electrically insulated therefrom, and is known practice. Secondly, the device 36 may be mounted upside down on the wall 34, utilizing the screws 70 and 72 as aforesaid but entering the passageways 66 and 68 in reverse direction. This mounting orientation for the transistor 20, with the electrode leads oriented upwardly, is desirable at times, depending on design considerations.

Provision is also made for side mounting of the device 36 on a wall. To this end an adjacent pair of fins are provided with flat wall portions 82 and 84 defining an open slot 86 between their facing walls, as best seen in FIG. 1. The slot 86 is arranged to receive screw shanks with the heads of the screws disposed on the interior sides of the wall portions 82 and 84, with the wall portions secured adjacent the mounting wall, as will be readily understood.

Figure 5:
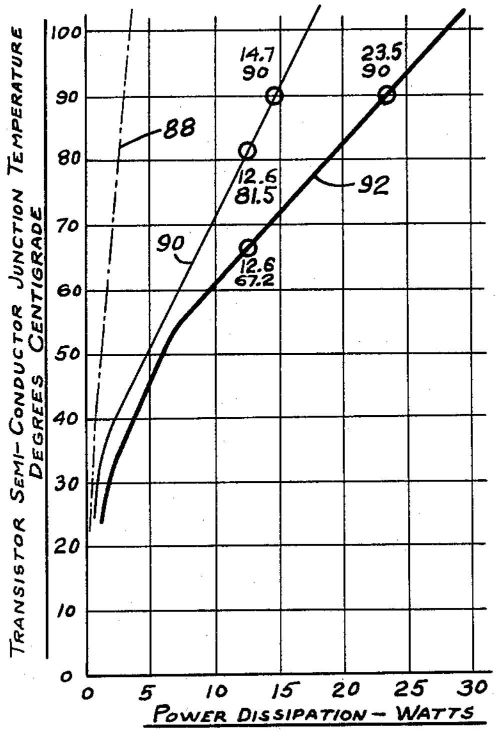
FIG. 5 is a graph showing curves of power dissipation vs. junction temperature for one type of transistor under various mounting conditions.
Figure 2:
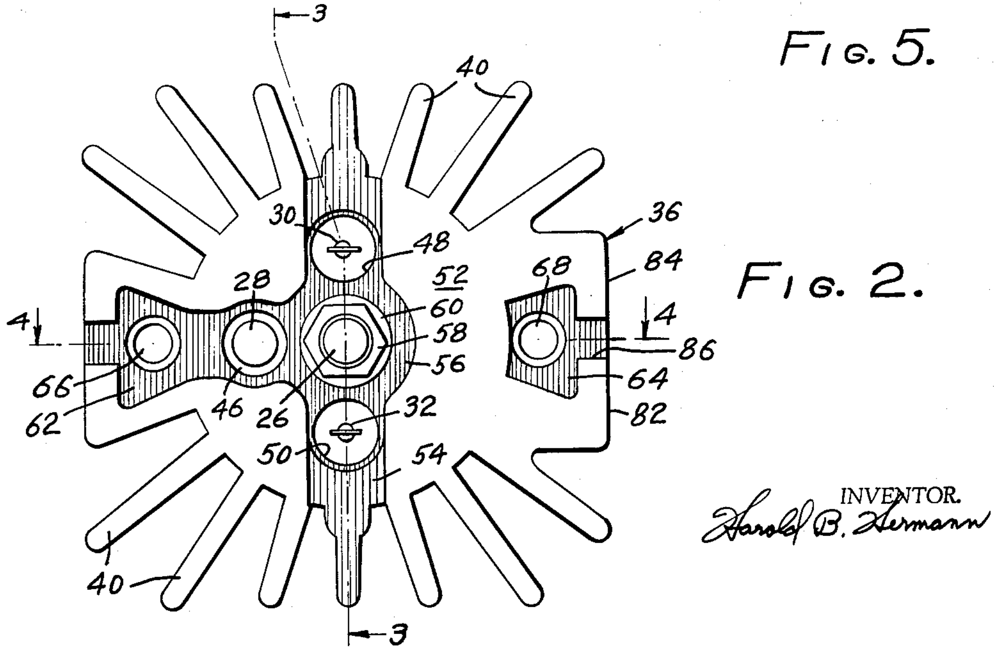
FIG. 2 is a bottom plan view of the mounting device or apparatus illustrated in FIG. 1, with the transistor mounted thereon.

The structural device 36 described above thus provides flexibility in mounting considerations for transistors, and in addition achieves a high order of heat transfer from the transistor. Heat transfer is obtained by radiation and convection from the fins and/or by way of conduction from the web portion 38 and the end surfaces of the fins to the wall upon which the assembly is mounted. Referring to FIG. 5, there is shown typical curves of free air power dissipation for one type of transistor vs. the transistor junction temperature, illustrating the high degree of utility achieved by the invention. The curves are based on data obtained under standard prescribed conditions at an ambient temperature of 25° C.

The curve designated by the reference numeral 88 shows operating conditions for an unmounted typical power transistor, while curve 90 shows the operating conditions for the same transistor mounted on a 6-inch by 6-inch plate of ⅛ inch aluminum in the usual currently accepted manner. Curve 92 shows the operating conditions for the same transistor secured to a device according to the invention and with the device secured to an aluminum wall as aforesaid.

The high order of power dissipation increase by the use of the invention is readily apparent. Thus, at a junction temperature of 90° C. there is obtained an increase from 14.7 watts dissipation for a transistor mounted according to known methods to 23.5 watts dissipation for the same transistor mounted in accordance with the invention. Stated another way, for a power dissipation of 12.6 watts in both cases, the transistor in the first case will have a junction temperature of 81.5° C., whereas the transistor in the second case will be operating at a mere 67.2° C. junction temperature.

Accordingly, it will be seen that the invention not only provides flexibility in mounting transistors but also provides an unexpected benefit by way of enhanced operating characteristics. With the invention, the design engineer now has at his disposal a transistor mounting device which affords him considerable latitude of design freedom as to mounting orientation with the added dividend of lower junction temperature or higher power dissipation or both.

It will be understood that while a preferred embodiment has been shown and described, variations may be made without departing from the spirit and scope of the invention. For example, the web 38 may be of diamond shape, rather than cylindrical, in order to accommodate transistors designated by the JEDEC TO3 type. Similarly, while the heat transfer fins have been shown as parallel to and extending generally radially outwardly from the axis of the web 38, it will be at once apparent to those skilled in the art that the web 38 could be of such configuration that the webs would extend outwardly therefrom in a different direction than as shown. For example, the web could extend beyond the periphery of the transistor with the heat transfer fins extending upwardly from the web extension and in a horizontal direction.

I claim:

1. A device for mounting on a receiving surface of a wall a transistor having conductor leads and a mounting stud extending outwardly from a mounting surface thereof, comprising:

a disk-like body having first and second parallel surfaces displaced from each other a distance greater than the length of said transistor mounting stud, said body being provided with passageways therethrough extending perpendicularly from one of said body surfaces to the other, one of said body surfaces being arranged for the intimately adjacent reception of said transistor mounting surface with said transistor mounting stud extending through one of said passageways and said conductor leads through others of said passageways and spaced from the walls thereof, said body defining a recessed well extending partially thereinto from the other of said body surfaces and at least in part along the axis of said one of said passageways, said well providing sufficient space for the reception of means to cooperate with said transistor mounting stud to secure said transistor to said body;

and means for securing said body to said wall with said other of said body surfaces intimately adjacent said receiving surface of said wall.

2. A device for mounting on a receiving surface of a wall a transistor having conductor leads and a mounting stud extending outwardly from a mounting surface thereof, comprising:

a disk-like body having first and second parallel surfaces displaced from each other a distance greater than the length of said transistor mounting stud, said body being provided with passageways therethrough extending perpendicularly from one of said body surfaces to the other, one of said body surfaces being arranged for the intimately adjacent reception of said transistor mounting surface with said transistor mounting stud extending through one of said passageways and said conductor leads through others of said passageways and spaced from the walls thereof, said body defining a recessed well extending partially thereinto from the other of said body surfaces and at least in part along the axis of said one of said passageways, said well providing sufficient space for the reception of means to cooperate with said transistor mounting stud to secure said transistor to said body;

heat transfer fin means extending from a peripheral portion of said body;

and means for securing said body to said wall with said other of said body surfaces intimately adjacent said receiving surface of said wall.

References Cited by the Examiner

UNITED STATES PATENTS

| | | | |
|---|---|---|---|
| 2,917,286 | 12/1959 | Deakin | 317—234 |
| 2,964,688 | 12/1960 | McAdam | 317—234 |
| 3,033,537 | 5/1962 | Brown | 317—234 |

FOREIGN PATENTS 1,064,639 9/1959 Germany.

OTHER REFERENCES

IERC Product (By International Electronic Research Corporation, 145 West Magnolia Boulevard, Burbank, California) Heat Dissipators for TO–6 and TO–5 Transistors—Sheet Publication, page 120, July 1, 1959.

JOHN W. HUCKERT, *Primary Examiner.*

DAVID J. GALVIN, J. A. ATKINS, J. D. KALLAM, *Assistant Examiners.*